(12) United States Patent
Wei

(10) Patent No.: US 11,882,662 B2
(45) Date of Patent: Jan. 23, 2024

(54) RECEIVING OPTICAL SYSTEM, LASER RECEIVING MODULE, LIDAR, AND OPTICAL ADJUSTMENT METHOD

(71) Applicant: SUTENG INNOVATION TECHNOLOGY CO., LTD., Shenzhen (CN)

(72) Inventor: Wei Wei, Shenzhen (CN)

(73) Assignee: SUTENG INNOVATION TECHNOLOGY CO., LTD., Shenzhen (CN)

(*) Notice: Subject to any disclaimer, the term of this patent is extended or adjusted under 35 U.S.C. 154(b) by 234 days.

(21) Appl. No.: 17/586,835

(22) Filed: Jan. 28, 2022

(65) Prior Publication Data
US 2022/0146635 A1    May 12, 2022

Related U.S. Application Data

(63) Continuation of application No. PCT/CN2019/098166, filed on Jul. 29, 2019.

(51) Int. Cl.
*G01S 7/48* (2006.01)
*H05K 3/00* (2006.01)
*G02B 3/00* (2006.01)
*G01S 7/52* (2006.01)
*G02B 13/00* (2006.01)
*G01S 7/481* (2006.01)

(52) U.S. Cl.
CPC ........ *H05K 3/0008* (2013.01); *G01S 7/52023* (2013.01); *G02B 3/0037* (2013.01); *G02B 13/004* (2013.01); *G01S 7/4816* (2013.01); *G02B 2003/0093* (2013.01)

(58) Field of Classification Search
CPC . H05K 3/0008; G01S 7/52023; G01S 7/4816; G01S 7/481; G01S 17/08; G01S 7/48; G02B 3/0037; G02B 13/004; G02B 2003/0093; G02B 27/0911; G02B 27/0916; G02B 27/0955; G02B 27/30; G02B 3/00; Y02A 90/10
See application file for complete search history.

(56) References Cited

U.S. PATENT DOCUMENTS 5,719,567 A * 2/1998 Norris ............... G08G 5/0021
398/115
5,933,225 A * 8/1999 Yamabuchi ........... G01S 17/931
180/169

(Continued)

FOREIGN PATENT DOCUMENTS

CN    108226901 A    6/2018

*Primary Examiner* — Balram T Parbadia
(74) *Attorney, Agent, or Firm* — BAYES PLLC

(57) ABSTRACT

This application pertains to the technical field of LiDAR, and discloses a receiving optical system, a laser receiving module, a LiDAR, and an optical adjustment method. The receiving optical system includes an optical receiving module and a first cylindrical lens. The optical receiving module is configured to receive a reflected laser and focus the received reflected laser. The first cylindrical lens is configured to receive the focused reflected laser and adjust the reflected laser in a first direction. Therefore, the receiving optical system can better perform matching on the photosensitive surface of the receiving sensor, and the energy receiving efficiency of the system is relatively high.

13 Claims, 9 Drawing Sheets

(56) References Cited

U.S. PATENT DOCUMENTS

| | | | | |
|---|---|---|---|---|
| 7,030,968 B2* | 4/2006 | D'Aligny | ............... | G01B 11/24 |
| | | | | 356/139.1 |
| 10,488,496 B2* | 11/2019 | Campbell | ............. | G01S 7/4817 |
| 10,534,085 B2* | 1/2020 | Kawazoe | ............. | G01S 7/4865 |
| 10,884,256 B2* | 1/2021 | Niwa | ................ | G02B 27/0955 |
| 2006/0109450 A1* | 5/2006 | Liu | ................. | G01S 7/4812 |
| | | | | 356/4.03 |
| 2009/0147239 A1* | 6/2009 | Zhu | ................. | G01S 7/4817 |
| | | | | 356/5.01 |
| 2016/0380410 A1* | 12/2016 | Song | ................ | G02B 27/10 |
| | | | | 359/639 |
| 2020/0124708 A1* | 4/2020 | Gimpel | ................ | G01S 7/4816 |

* cited by examiner

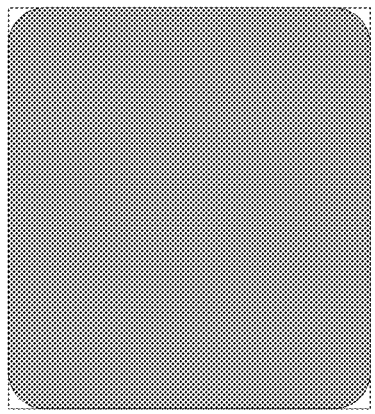
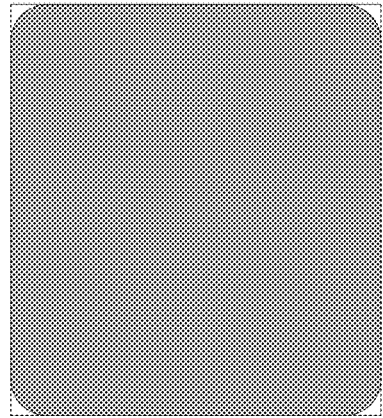
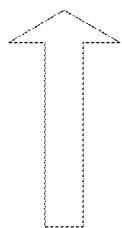
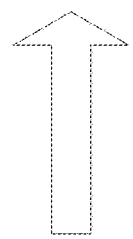
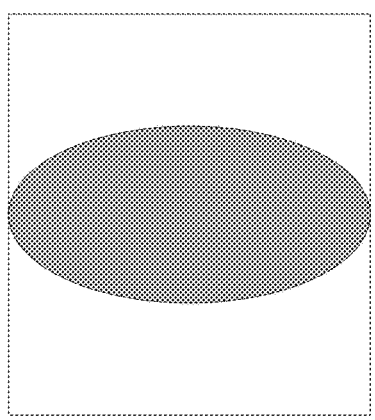
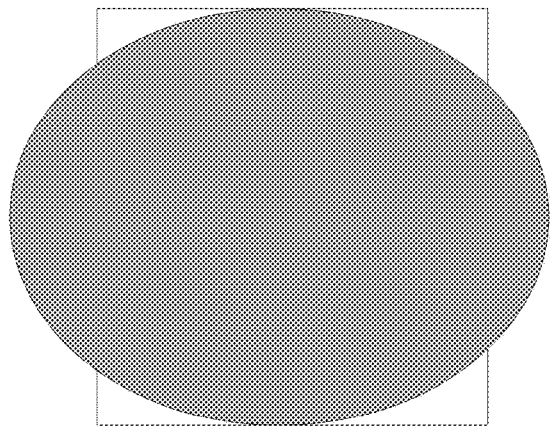
FIG. 2A
FIG. 2B

RECEIVING OPTICAL SYSTEM, LASER RECEIVING MODULE, LIDAR, AND OPTICAL ADJUSTMENT METHOD

CROSS-REFERENCE TO RELATED APPLICATION

The present application is a continuation of International Application No. PCT/CN2019/098166, filed on Jul. 29, 2019, which is incorporated herein by reference in its entirety.

TECHNICAL FIELD

This application relates to the technical field of LiDAR, and in particular, to a receiving optical system, a laser receiving module, a LiDAR, and an optical adjustment method.

BACKGROUND

As technologies develop, LiDAR is widely applied in the field of smart devices such as autonomous driving, smart robot navigation, and unmanned aerial vehicles, and in scenarios such as environment detection and spatial modelling. The LiDAR is a radar system that emits laser beams to obtain characteristics such as position and speed of target objects. A working principle of the LiDAR is to first emit transmitted light signals to the target object, then compare received light signals reflected from the target object with transmitted light signals, and process the signals to obtain relevant information of the target object, such as parameters of the target, for example, distance, azimuth, height, speed, posture, and shape.

The receiving optical system of the LiDAR is used to collect and focus the reflected laser on a receiving sensor. In the prior art, a frequently-used method is to design the receiving optical system into a telescope with central rotational symmetry. Actually, in solid-state LiDAR, an outgoing laser emitted by a frequently-used laser source is irregular. Therefore, the receiving sensor has difficulty in effectively receiving the reflected laser, which causes low energy utilization for the reflected laser and poor interference resistance to ambient light.

SUMMARY

Embodiments of this application aim to provide a receiving optical system, a laser receiving module, a LiDAR, an optical adjustment method, and a smart sensing device, to resolve a prior-art technical problem of low energy utilization and poor anti-interference performance.

An embodiment of the present invention provides a receiving optical system, including an optical receiving module and a first cylindrical lens, where the optical receiving module is configured to receive a reflected laser and focus the received reflected laser; and the first cylindrical lens is configured to receive the focused reflected laser and adjust the reflected laser in a first direction.

Further, the optical receiving module includes a first receiving lens and a second receiving lens;

the first receiving lens is configured to focus the received reflected laser, and switch the reflected laser from a first beam diameter to a second beam diameter; and the second receiving lens is configured to receive the reflected laser switched to the second beam diameter, switch the reflected laser to a third beam diameter, and emit the reflected laser of the third beam diameter toward the first cylindrical lens.

Further, the first receiving lens is a convex spherical lens, and the second receiving lens is a concave spherical lens.

Further, the concave spherical lens and the first cylindrical lens are integrated, and a surface of the concave spherical lens faces the convex spherical lens.

Further, the first cylindrical lens diffuses the reflected laser in the first direction.

Further, the receiving optical system further includes a second cylindrical lens; and the second cylindrical lens is configured to receive the reflected laser adjusted by the first cylindrical lens, and readjust the reflected laser in the second direction.

Further, the second cylindrical lens diffuses the reflected laser in the second direction.

Further, the first direction in which the first cylindrical lens adjusts the reflected laser is the same as the second direction in which the second cylindrical lens adjusts the reflected laser.

Further, the receiving optical system further includes a receiving lens barrel and a receiving lens barrel cover, where the first receiving lens, the second receiving lens, the first cylindrical lens, and the second cylindrical lens are sequentially provided in the receiving lens barrel, and the receiving lens barrel cover is fixed at an end of the receiving lens barrel.

Further, a first receiving spacer ring is provided between the first receiving lens and the second receiving lens.

Further, a second receiving spacer ring is provided between the first cylindrical lens and the second cylindrical lens.

Further, an inner wall of the first receiving spacer ring and/or the second receiving spacer ring is an extinct thread and/or an extinct coating.

Further, same side faces of a first lens, a second lens, the first cylindrical lens, and the second cylindrical lens are all set as planes.

An embodiment of the present invention further provides a laser receiving module, including a receiving module and the receiving optical system provided in the foregoing embodiments;

an incident end of the receiving module is aligned and connected with an outgoing end of the receiving optical system, and is configured to receive a reflected laser; and the receiving module includes a receiving sensor and a receiving circuit board, the receiving sensor is configured to receive the reflected laser, convert a light signal into an electrical signal, and then send the electrical signal to the receiving circuit board, and the receiving circuit board processes the received electrical signal.

Further, the receiving module further includes a receiving housing, and the receiving sensor and the receiving circuit board are accommodated in the receiving housing.

An embodiment of the present invention further provides an optical adjustment method for a laser receiving module, applied to the laser receiving module provided in the foregoing embodiments, and the method includes:

arranging a first receiving lens, a first receiving spacer ring, a second receiving lens, a first cylindrical lens, the second receiving spacer ring, and the second cylindrical lens in a receiving lens barrel, and fixing a receiving lens barrel cover at an end of the receiving lens barrel, to obtain a receiving optical system;

adjusting positions of the receiving module and the receiving optical system; and when an optical axis of the receiving optical system is aligned with a receiving sensor of the receiving module, fixing the receiving optical system and the receiving module, to obtain the laser receiving module.

An embodiment of the present invention further provides a LiDAR, including at least one laser receiving module provided in the foregoing embodiments, and further including at least one laser emission module and at least one beam splitting module, where the laser emission module is configured to emit a collimated outgoing laser, the beam splitting module is configured to allow the outgoing laser to be emitted after passing through, and direct a reflected laser with a same incident axis as the outgoing laser toward the laser receiving module, and the laser receiving module is configured to receive the reflected laser.

The LiDAR further includes a reflector module, where an incident port of the reflector module is connected with the beam splitting module, and an outgoing port of the reflector module is connected with the laser receiving module, and is configured to deflect, toward the laser receiving module, the reflected laser received by the beam splitting module.

The LiDAR further includes: a scanning module, where the scanning module is configured to receive an outgoing laser passing through the beam splitting module and direct the outgoing laser outward into a detection region, and is further configured to receive a reflected laser returning from the detection region and direct the reflected laser toward the beam splitting module.

Further, the laser emission module, the beam splitting module, the laser receiving module, and the reflector module are provided in an integrated transceiver housing. The emission module, the beam splitting module, the receiving module, and the reflector module are positioned and fixed by a preset structure.

An embodiment of the present invention further provides a smart sensing device, including the LiDAR in the foregoing embodiments.

It can be seen from the foregoing description that, in the embodiments of the present invention, the optical receiving module and the first cylindrical lens are arranged, the optical receiving module adjusts the beam diameter of the reflected laser, and the first cylindrical lens corrects the shape of the light spot in a direction, so that the received reflected laser can better match the photosensitive surface of the receiving sensor, and therefore, all the reflected lasers received by the receiving optical system can be directed to the photosensitive surface of the receiving sensor after being focused and corrected, and all the reflected lasers can be received by the receiving sensor, thereby improving utilization of received energy. In addition, stray light outside an optical path of the reflected lasers and/or stray light in a direction different from that of the reflected lasers cannot be directed to the receiving sensor after passing through the receiving optical system, thereby avoiding an interference problem caused when the stray light is received by the receiving sensor. A percentage of receiving energy of the reflected laser by the LiDAR is high, and a capability of inhibiting interference light and the stray light is greatly improved.

BRIEF DESCRIPTION OF THE DIAGRAMS

One or more embodiments are described by using examples with reference to diagrams in drawings corresponding to the embodiments. These exemplary descriptions do not constitute a limitation to the embodiments. Elements with the same reference signs in the drawings indicate similar elements. Unless otherwise stated, the diagrams in the drawings do not constitute a proportional limitation.

FIG. 2A is a diagram of a laser receiving effect according to an embodiment of the present invention;

FIG. 2B is a diagram of another laser receiving effect according to an embodiment of the present invention;

Figure 1:
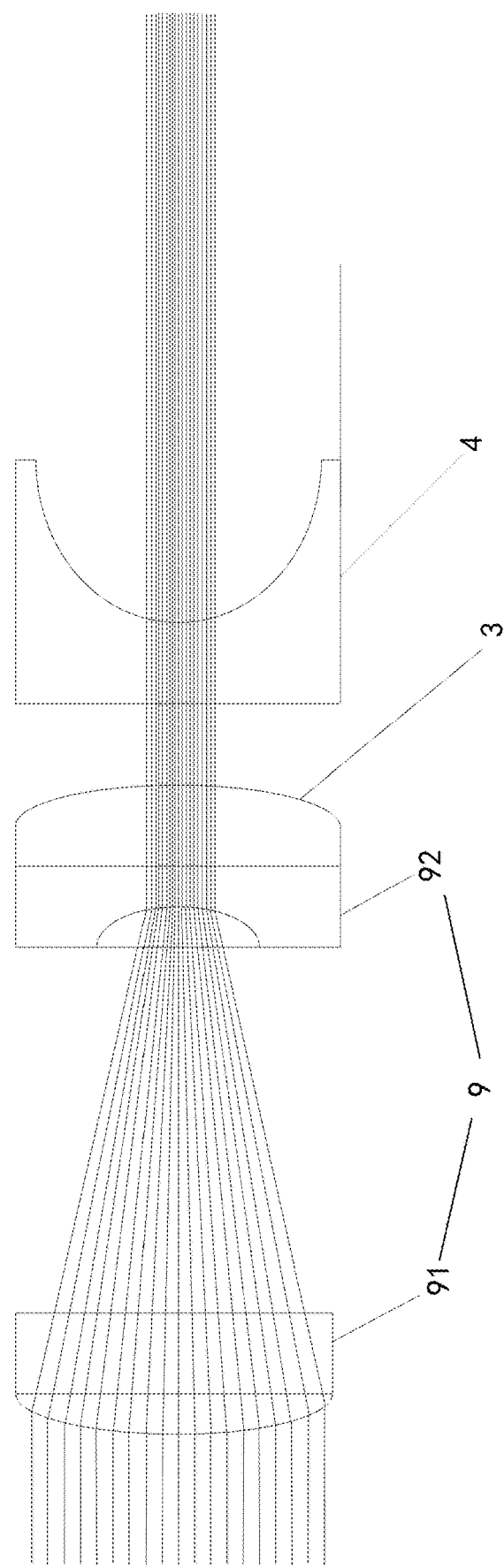
FIG. 1 is a schematic diagram of a receiving optical system according to an embodiment of the present invention.

Reference signs in the specific embodiments are as follows:

| | |
|---|---|
| Convex spherical lens 1 | Receiving lens barrel 61 |
| Concave spherical lens 2 | Receiving lens barrel cover 63 |
| Optical receiving module 9 | First receiving lens 91 |
| Second receiving lens 92 | First housing 71 |
| First cylindrical lens 3 | Receiving sensor 73 |
| Second cylindrical lens 4 | Receiving circuit board 74 |
| First receiving spacer ring 51 | Second housing 75 |
| Second receiving spacer ring 53 | Transceiver assembly 10 |
| LiDAR 100 | Beam splitting module 12 |
| Laser emission module 11 | Beam splitter support component 121 |
| Laser emission module 111 | Lock block 122 |
| Collimating element 112 | Reflector module 14 |
| Laser receiving module 13 | Reflector support component 141 |
| Receiving module 131 | Reflector cover 142 |
| Receiving optical system 132 | Collimating element 32 |
| Base 20 | Reflector module 34 |
| Laser emission module 31 | Receiving module 36 |
| Beam splitting module 33 | Target object 200 |
| Receiving optical system 35 | |

DESCRIPTION OF THE INVENTION

The following describes embodiments of technical solutions in this application in detail with reference to accompanying drawings. The following embodiments are only used to describe the technical solutions of this application more clearly, and therefore, are only used as examples, and cannot be used to limit the protection scope of this application.

A divergence angle of a reflected laser received by a receiving optical system of a LiDAR matches a divergence angle of an outgoing laser, but outgoing lasers emitted by a frequently-used laser emitter are asymmetrical, and reflected lasers returning after being reflected by an object are also asymmetrical. The receiving optical system is used to focus the reflected laser on a receiving sensor, a photosensitive surface of the receiving sensor matches a shape of a light spot of the reflected laser, and therefore, energy utilization of the reflected laser is high and resistance to ambient light interference is good. Asymmetry of the reflected laser makes it more difficult for the reflected laser to match the photosensitive surface of the receiving sensor after being focused by the receiving optical system. Therefore, to match the shape of the light spot of the reflected laser focused by the receiving optical system with the photosensitive surface of the receiving sensor, an embodiment of the present invention provides a receiving optical system, a laser receiving module, an optical adjustment method for the laser receiving module, and a LiDAR.

FIG. 1 shows a receiving optical system provided in an embodiment of the present invention. The receiving optical system includes an optical receiving module 9 and a first cylindrical lens 3.

The optical receiving module 9 is configured to receive a reflected laser and focus the received reflected laser.

The first cylindrical lens 3 is configured to receive the focused reflected laser and adjust the reflected laser in a first direction.

Outgoing lasers emitted by a frequently-used laser emitter in a LiDAR are asymmetrical. For example, a long-axis diameter and a short-axis diameter of a light spot of the outgoing laser of a semiconductor laser device are unequal, and a divergence angle of the reflected laser matches a divergence angle of the outgoing laser. After receiving reflected lasers, the optical receiving module 9 focuses the received reflected lasers in both a long-axis direction and a short-axis direction of the reflected lasers. Then the focused reflected laser is adjusted in a first direction through the first cylindrical lens 3, so that a shape of a light spot of the reflected laser matches a photosensitive surface of the receiving sensor. An adjusted effect is shown in FIG. 2A and FIG. 2B.

In the foregoing embodiments, with addition of the first cylindrical lens 3, the reflected lasers are adjusted in the first direction, then a diameter and the shape of the light spot of the reflected lasers directed by the first cylindrical lens 3 to the receiving sensor are adjusted and corrected, and therefore, all the reflected lasers received by the receiving optical system can be directed to the photosensitive surface of the receiving sensor after being focused and corrected, and all the reflected lasers can be received by the receiving sensor, thereby improving utilization of received energy. In addition, stray light outside an optical path of the reflected lasers and/or stray light in a direction different from that of the reflected lasers cannot be directed to the receiving sensor after passing through the receiving optical system, thereby avoiding an interference problem caused when the stray light is received by the receiving sensor. Therefore, energy receiving efficiency of the reflected lasers is high, and a capability of inhibiting interference light and the stray light is greatly improved.

Further, there may be various forms of the optical receiving module 9 mentioned above. The optical receiving module 9 provided in this embodiment of the present invention is shown in FIG. 1. The optical receiving module 9 includes a first receiving lens 91 and a second receiving lens 92. The first receiving lens 91 is configured to focus the received reflected laser and switch the reflected laser from a first beam diameter to a second beam diameter. The second receiving lens 92 is configured to receive the reflected laser switched to the second beam diameter, switch the reflected laser to a third beam diameter, and direct the reflected laser of the third beam diameter to the first cylindrical lens. The third beam diameter is greater than or approximately equal to the second beam diameter, and the second beam diameter is less than the first beam diameter. Through the first receiving lens 91 and the second receiving lens 92, the beam diameter of the reflected laser is gradually switched to a beam diameter basically matching the photosensitive surface of the receiving sensor.

Preferably, the first receiving lens 91 is a convex spherical lens 1, and the second receiving lens 92 is a concave spherical lens 2. The convex spherical lens 1 is configured to switch the received reflected laser from the first beam diameter to the second beam diameter. The concave spherical lens 2 is configured to receive the reflected laser switched to the second beam diameter, switch the reflected laser to the third beam diameter, and direct the reflected laser of the third beam diameter to the first cylindrical lens 3. Certainly, the optical receiving module 9 may have another structure. Details are not described herein. The following uses the convex spherical lens 1 and the concave spherical lens 2 as an example for description.

Figure 3:
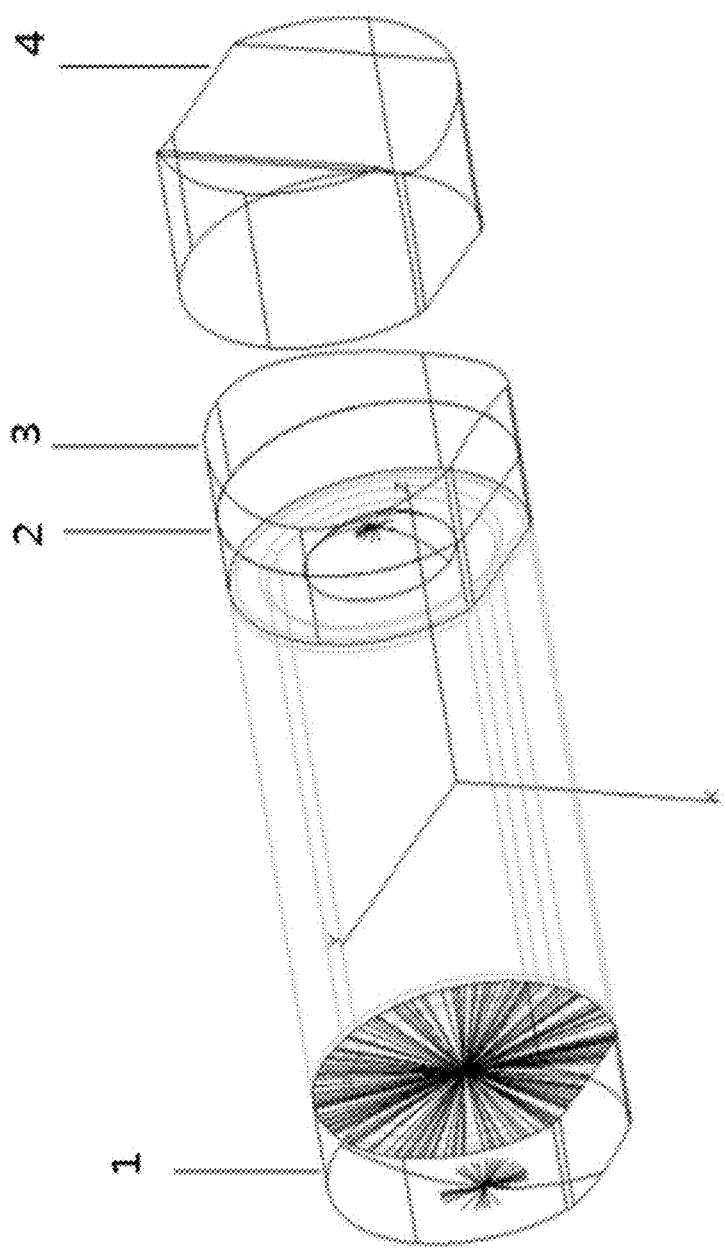
FIG. 3 is a structural diagram of a receiving optical system according to an embodiment of the present invention.

As shown in FIG. 3, the convex spherical lens 1, the concave spherical lens 2, and the first cylindrical lens 3 are arranged linearly. For the laser receiving system, the reflected lasers can usually be viewed as incident quasi-parallel lasers with a large diameter. The convex spherical lens 1 is arranged, to switch the reflected laser from a reflected laser of a large beam diameter to a reflected laser of a small beam diameter, that is, to switch incident light from the first beam diameter to the second beam diameter. A distance between the convex spherical lens 1 and the concave spherical lens 2 is related to a magnitude of the second beam diameter to which the reflected laser needs to be switched, and the distance between the convex spherical lens 1 and the concave spherical lens 2 can be adjusted to adjust the diameter of the reflected laser.

In addition, as shown in FIG. 3, for the reflected laser adjusted by the convex spherical lens 1, the concave spherical lens 2 readjusts an optical path of the reflected laser to switch the reflected laser to the quasi-parallel laser at a small divergence angle. This is equivalent to outputting a small-diameter beam at a small divergence angle. The beam diameter of the reflected laser needs to match the size of the photosensitive surface of the receiving sensor, and the reflected laser directed from the receiving optical system to the receiving sensor is at a small divergence angle, and can be regarded as the quasi-parallel laser. Curvature of lenses and a combination of lenses in the system can be changed, to adjust the beam diameter and the divergence angle of the reflected laser.

In actual application, a LiDAR usually uses a semiconductor laser device to emit an outgoing laser, outgoing lasers emitted by the semiconductor laser device are asymmetrical, the reflected lasers returning after being reflected by the object are also asymmetrical, and as a result, the photosensitive surface of the receiving sensor does not match the shape of the light spot of the reflected lasers. If a long-axis diameter of the reflected lasers focused by the optical receiving module 9 matches the photosensitive surface of the receiving sensor, as shown in FIG. 2A, a short-axis diameter is less than a length of the photosensitive surface, and a position of the photosensitive surface that receives no reflected laser is vulnerable to an adverse effect caused by interference light; or if the short-axis diameter matches the photosensitive surface of the receiving sensor, as shown in FIG. 2B, the long-axis diameter is greater than the length of the photosensitive surface, and some reflected lasers are not received by the photosensitive surface, thereby causing low utilization of the reflected lasers. Therefore, as shown in FIG. 1, the first cylindrical lens 3 is arranged herein, to perform beam adjustment on the received reflected laser, that is, the quasi-parallel laser. After the first cylindrical lens 3 is introduced, the reflected laser is adjusted in the first direction. If a short-axis diameter is less than the length of the photosensitive surface, the first cylindrical lens 3 diffuses lasers in the short-axis direction to enlarge the short-axis diameter of the light spot, so that the short-axis diameter can match the photosensitive surface of the receiving sensor well; or if the long-axis diameter is greater than the length of the photosensitive surface, the first cylindrical lens 3 focuses lasers in the long-axis direction to reduce the long-axis diameter of the light spot, so that the shape of the light spot of the reflected laser can better match the photosensitive surface of the sensor. Therefore, all the reflected lasers received by the receiving optical system can be directed to the photosensitive surface of the receiving sensor after being focused and corrected, and all the reflected lasers can be received by the receiving sensor, thereby improving utilization of received energy. In addition, stray light outside an optical path of the reflected lasers and/or stray light in a direction different from that of the reflected lasers cannot be directed to the receiving sensor after passing through the receiving optical system, thereby avoiding an interference problem caused when the stray light is received by the receiving sensor. Not only the receiving efficiency of the laser receiving module is ensured, but also the receiving angle of view of LiDAR is confined, thereby implementing an excellent inhibition effect on the ambient light and reducing interference from stray light or the ambient light. As shown in FIG. 2A and FIG. 2B, an original elliptical shape of the light spot can be identified, and after correction by the cylindrical lens, the shape of the light spot of the reflected laser can match the photosensitive surface of the receiving sensor well. In an actual process, the system can design the curvature and the type of the first cylindrical lens 3 based on the shape of the light spot, so that the corrected reflected laser can better fit the shape of the receiving sensor. Specifically, the long-axis diameter of the reflected lasers focused by the optical receiving module 9 matches the photosensitive surface of the receiving sensor, and the first cylindrical lens diffuses the reflected lasers in the first direction, that is, the short-axis direction, to enlarge a diameter of the light spot, so that the shape of the light spot matches the photosensitive surface of the receiving sensor.

Optionally, the short-axis diameter of the reflected lasers focused by the optical receiving module 9 matches the photosensitive surface of the receiving sensor, and the first cylindrical lens 3 focuses the reflected lasers in the first direction, that is, the long-axis direction, to reduce a diameter of the light spot, so that the shape of the light spot matches the photosensitive surface of the receiving sensor.

Preferably, the concave spherical lens 2 and the first cylindrical lens 3 can be integrated as a spherical cylindrical lens, and a side of the concave spherical lens 2 is close to the convex spherical lens 1, so that the beam diameter of the reflected laser can be adjusted while the shape of the light spot of the reflected laser is corrected in a direction, thereby reducing an occupied volume and making a structure of the receiving optical system more compact.

Certainly, in the actual process, the shape of the light spot may change irregularly in a plurality of directions, or change greatly in the same direction, and consequently, a plurality of cylindrical lens may be arranged for adjustment in the same direction or in different directions, for example, focus or diffusion. As shown in FIG. 1, in this embodiment of the present invention, a second cylindrical lens 4 is further provided and configured to receive the reflected laser adjusted by the first cylindrical lens 3, and readjust the reflected laser in the second direction, so that the shape of the light spot can better match the photosensitive surface of the receiving sensor. Optionally, the first direction in which the first cylindrical lens 3 adjusts the reflected laser is the same as the second direction in which the second cylindrical lens 4 adjusts the reflected laser. Specifically, after the first cylindrical lens 3 diffuses the reflected laser in the first direction, that is, the short-axis direction, the reflected laser is further diffused in the first direction, thereby accurately adjusting the diameter of the light spot of the reflected laser in the first direction and also reducing a difficulty of processing the first cylindrical lens 3 and the second cylindrical lens 4. Optionally, after the first cylindrical lens 3 diffuses the reflected laser in the first direction, that is, the short-axis direction, the reflected laser is focused in the first direction, thereby accurately adjusting the diameter of the light spot of the reflected laser in the first direction and also reducing a difficulty of processing the first cylindrical lens 3 and the second cylindrical lens 4. Optionally, after the first cylindrical lens 3 focuses the reflected laser in the first direction, that is, the long-axis direction, the reflected laser is further focused in the first direction. Optionally, after the first cylindrical lens 3 focuses the reflected laser in the first direction, that is, the long-axis direction, the reflected laser is further diffused in the first direction.

In another optional embodiment, the first direction is perpendicular to the second direction, after the first cylindrical lens 3 diffuses the reflected laser in the first direction, that is, the short-axis direction, and the reflected laser further is focused or diffused in the second direction, that is, the long-axis direction. Optionally, after the first cylindrical lens 3 focuses the reflected laser in the first direction, that is, the long-axis direction, the reflected laser further is focused or diffused in the second direction, that is, the short-axis direction.

This embodiment imposes no limitation on the adjustment (such as focusing or diffusion) performed by the first cylindrical lens 3 and the second cylindrical lens 4 on the light spot of the reflected laser and the adjustment direction, provided that the shape of the light spot can match the photosensitive surface of the receiving sensor after the light spot of the reflected laser is adjusted by the first cylindrical lens 3 and the second cylindrical lens 4.

Because the first cylindrical lens 3 and the second cylindrical lens 4 are introduced in the receiving optical system to adjust and correct the light spot of the reflected laser in the same direction or in different directions, and the first cylindrical lens 3 and the second cylindrical lens 4 in the receiving optical system are both rotationally symmetric structures, during an assembly process, mounting directions of the first cylindrical lens 3 and the second cylindrical lens 4 need to be confirmed, otherwise directions of the first cylindrical lens 3 and the second cylindrical lens 4 are likely to be faulty, causing a problem that the system cannot work normally, which increases the assembly difficulty and reduces the assembly efficiency. Therefore, in this embodiment of the present invention, the same side surfaces of the convex spherical lens 1, the concave spherical lens 2, the first cylindrical lens 3, and the second cylindrical lens 4 are cut flat, and the same side surfaces are set as planes. Specifically, as shown in FIG. 3, bottom surfaces of the convex spherical lens 1, the concave spherical lens 2, the first cylindrical lens 3, and the second cylindrical lens 4 are all set as planes through flattening processing, and therefore, during assembly, the flattened planes only need to face downward and be aligned to be assembled correctly, which reduces the assembly difficulty, avoids the malfunction problem of the receiving optical system due to the incorrect assembly direction, and improves the assembly efficiency.

Figure 4:
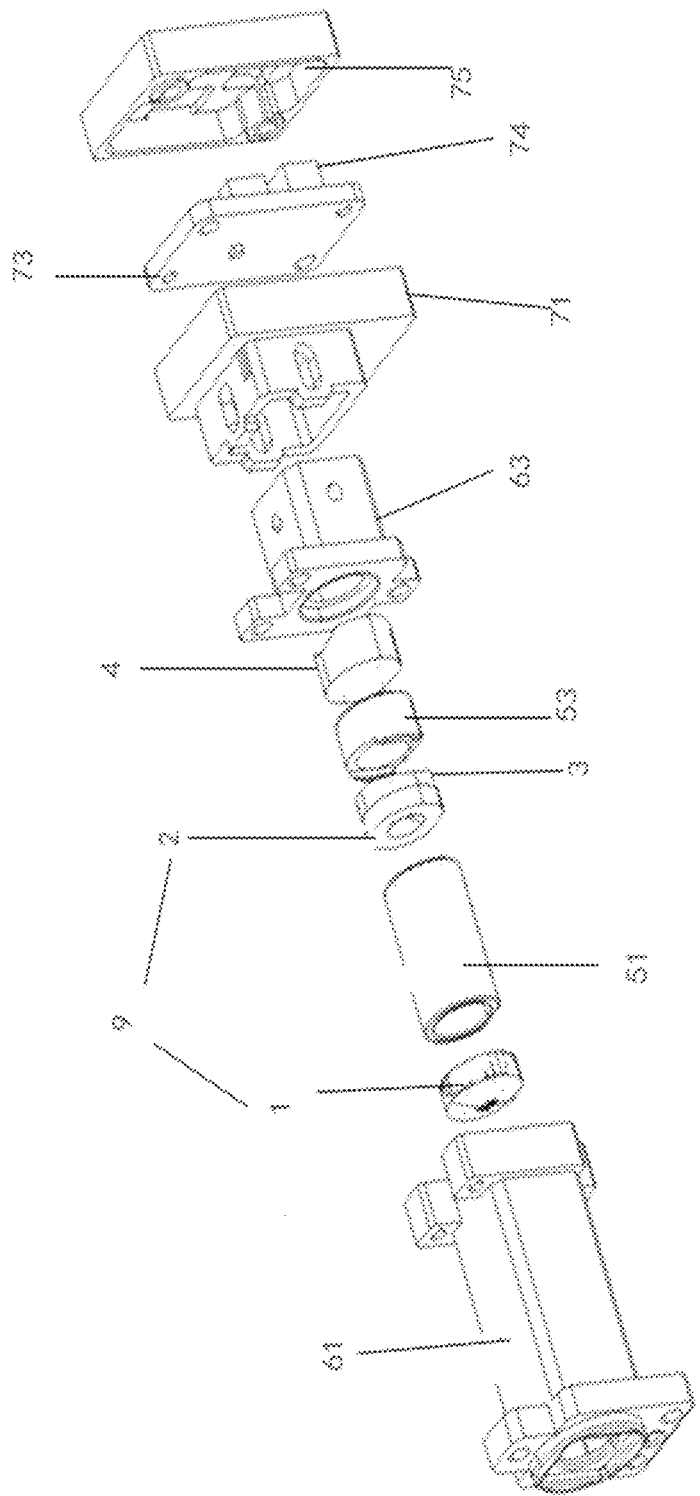
FIG. 4 is a structural diagram of a laser receiving module according to an embodiment of the present invention.

As shown in FIG. 4, further, the receiving optical system provided in this embodiment of the present invention further includes a receiving lens barrel 61 and a receiving lens barrel cover 63. The convex spherical lens 1, the concave spherical lens 2, the first cylindrical lens 3, and the second cylindrical lens 4 are sequentially provided in the receiving lens barrel 61, and the receiving lens barrel cover 63 is fixed at an end of the receiving lens barrel 61. Specifically, the convex spherical lens 1, the concave spherical lens 2, the first cylindrical lens 3, and the second cylindrical lens 4 are sequentially mounted in the receiving lens barrel 61, and an end of the receiving lens barrel 61 is fixed to the receiving lens barrel cover 63, so that the lens group is fixed in the receiving lens barrel 61.

In addition, because there is a preset distance between the convex spherical lens 1 and the concave spherical lens 2 based on an optical design, in this embodiment of the present invention, a first receiving spacer ring 51 is provided in the receiving lens barrel 61. A length of the first receiving spacer ring 51 is the preset distance between the convex spherical lens 1 and the concave spherical lens 2, and is a length of a gap between the convex spherical lens 1 and the concave spherical lens 2. A front end of the first receiving spacer ring 51 abuts against the convex spherical lens 1, and a rear end abuts against the concave spherical lens 2, which is also configured to press and fix the convex spherical lens 1 and the concave spherical lens 2. In addition, an inner wall of the first receiving spacer ring 51 needs to be subjected to matte treatment, which includes but is not limited to an extinct thread, an extinct coating, anodizing and sandblasting treatments, and the like, to avoid interference light generated when the laser is reflected by the inner wall of the first receiving spacer ring 51. Certainly, a second receiving spacer ring 53 is also provided between the first cylindrical lens 3 and the second cylindrical lens 4 for separating the first cylindrical lens 3 and the second cylindrical lens 4. In addition, an inner wall of the second receiving spacer ring 4 also needs to be subjected to the matte treatment.

In conclusion, in the receiving optical system provided in this embodiment of the present invention, the cylindrical lens is arranged, to adjust and correct the beam diameter and dimension of the reflected laser beam, so that the receiving optical system can better perform matching on the photosensitive surface of the receiving sensor, and therefore, all the reflected lasers received by the receiving optical system can be directed to the photosensitive surface of the receiving sensor after being focused and corrected, and all the reflected lasers can be received by the receiving sensor, thereby improving utilization of received energy. In addition, stray light outside an optical path of the reflected lasers and/or stray light in a direction different from that of the reflected lasers cannot be directed to the receiving sensor after passing through the receiving optical system, thereby avoiding an interference problem caused when the stray light is received by the receiving sensor. Therefore, energy receiving efficiency of the reflected lasers is high, and a capability of inhibiting interference light and the stray light is greatly improved.

In another embodiment of the present invention, based on the receiving optical system provided in the foregoing embodiments, a laser receiving module 13 is provided. As shown in FIG. 4, the laser receiving module 13 includes the foregoing receiving optical system, and further includes a receiving module. An incident end of the receiving module and an outgoing end of the receiving optical system are aligned and connected, to receive the reflected laser. The receiving module includes a receiving sensor 73 and a receiving circuit board 74. The receiving sensor 73 is configured to receive the reflected laser, convert the light signal into an electrical signal, and then send the electrical signal to the receiving circuit board 74. The receiving circuit board 74 processes the received electrical signal.

Preferably, as shown in FIG. 4, the receiving optical system includes a receiving lens barrel 61, a convex spherical lens 1, a concave spherical lens 2, a first cylindrical lens 3, and a receiving lens barrel cover 63.

The convex spherical lens 1, the concave spherical lens 2, and the first cylindrical lens 3 are sequentially arranged in the receiving lens barrel 61. The receiving lens barrel cover 63 is fixed at the end of the receiving lens barrel 61. The convex spherical lens 1 is configured to switch the received reflected laser from the first beam diameter to the second beam diameter. The concave spherical lens 2 is configured to receive the reflected laser switched to the second beam diameter, and switch the reflected laser to the third beam diameter. The first cylindrical lens 3 is configured to receive the reflected laser switched to the third beam diameter, and adjust the reflected laser in the first direction, so that the shape of the light spot of the reflected laser matches the photosensitive surface of the receiving sensor.

The receiving sensor is configured to receive the switched reflected laser, and convert the light signal into the electrical signal.

The receiving circuit board 73 processes the electrical signal sent by the receiving sensor.

The receiving module further includes a receiving housing, the receiving housing includes a first housing 71 and a second housing 75, and the first housing 71 and the second housing 75 are assembled to form a housing chamber. The receiving sensor 73 and the receiving circuit board 74 are accommodated in the housing chamber of the receiving housing, to fix the receiving sensor 73 and the receiving circuit board 74, thereby avoiding collision and damage.

The receiving lens barrel cover 63 of the receiving optical system is fixed and connected to the receiving housing of the receiving module to form the laser receiving module. Other structures of the receiving lens barrel 61 and the receiving lens barrel cover 63 are the same as those described in the foregoing embodiments. Details are not described herein again.

In conclusion, based on the laser receiving module provided in this embodiment of the present invention, the first cylindrical lens 3 is arranged, to adjust and correct the beam diameter and the light spot of the received reflected laser, so that the received reflected laser can better match the photosensitive surface of the receiving sensor, and therefore, all the reflected lasers received by the receiving optical system can be directed to the photosensitive surface of the receiving sensor after being focused and corrected, and all the reflected lasers can be received by the receiving sensor, thereby improving utilization of received energy. In addition, stray light outside an optical path of the reflected lasers and/or stray light in a direction different from that of the reflected lasers cannot be directed to the receiving sensor after passing through the receiving optical system, thereby avoiding an interference problem caused when the stray light is received by the receiving sensor. Therefore, efficiency of receiving energy of the reflected laser by the laser receiving module is high, a capability of inhibiting interference light and the stray light is greatly improved, and a volume of the laser receiving device is also reduced.

Figure 5:
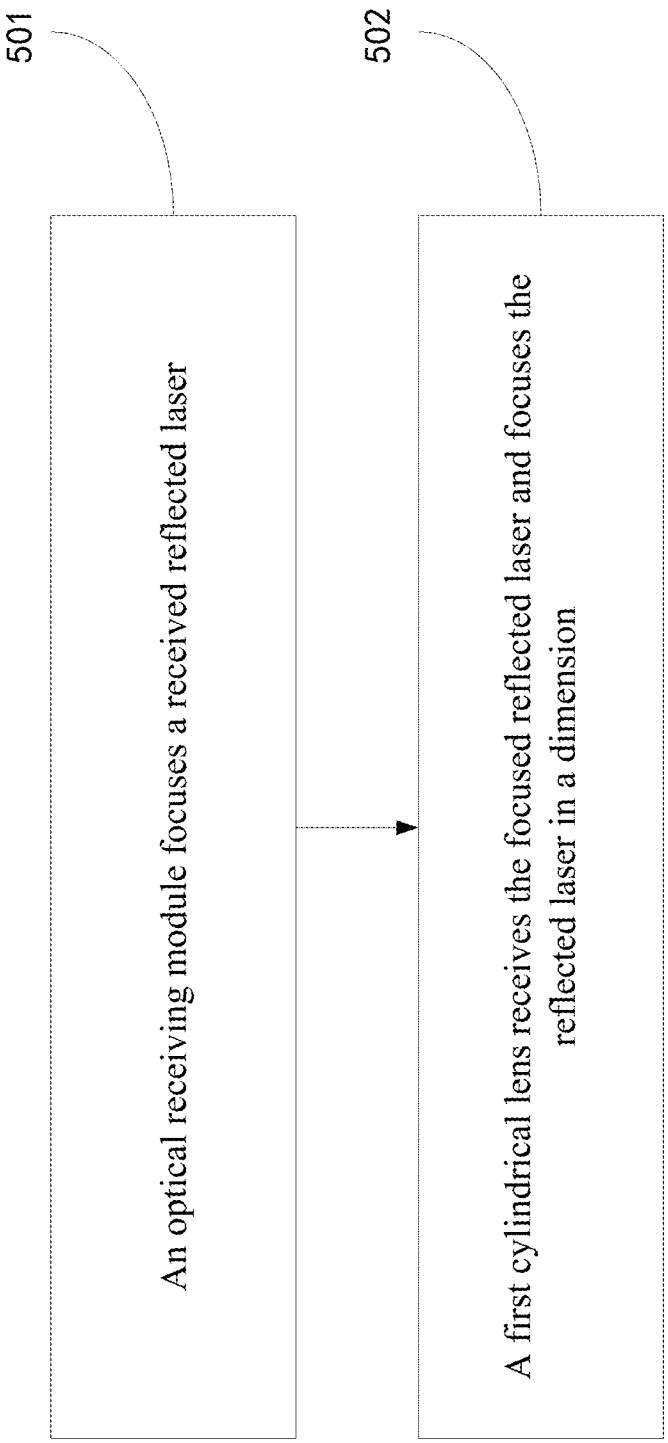
FIG. 5 is a flowchart of a laser receiving method according to an embodiment of the present invention.

An embodiment of the present invention further provides a laser receiving method. As shown in FIG. 5, the laser receiving method includes sequentially arranging an optical receiving module 9 and a first cylindrical lens on an optical path of a reflected laser in advance.

501. An optical receiving module 9 focuses a received reflected laser.

502. A first cylindrical lens 3 receives the focused reflected laser and adjusts the reflected laser in a first direction.

Preferably, the optical receiving module 9 includes a first receiving lens 91 and a second receiving lens 92.

Preferably, when the optical receiving module 9 focuses a received reflected laser, the method includes the following steps:

The first receiving lens 91 focuses the received reflected laser, and switches the reflected laser from a first beam diameter to a second beam diameter.

The second receiving lens 92 receives the reflected laser switched to the second beam diameter, switches the reflected laser to a third beam diameter, and emits the reflected laser of the third beam diameter toward the first cylindrical lens 3.

Preferably, the first receiving lens 91 is a convex spherical lens 1, and the second receiving lens 92 is a concave spherical lens 2.

Preferably, after the first cylindrical lens 3 receives the focused reflected laser and focuses the reflected laser in a dimension, the method further includes:

arranging a second cylindrical lens 4, to refocus the reflected laser focused by the first cylindrical lens 3.

Preferably, the first cylindrical lens 3 and the second cylindrical lens 4 focus the reflected laser in the same dimensional direction.

In the laser receiving method provided in this embodiment, the cylindrical lens is arranged, to adjust and correct the beam diameter of the reflected laser beam, so that the receiving optical system can better perform matching on the photosensitive surface of the receiving sensor 73, and therefore, all the reflected lasers received by the receiving optical system can be directed to the photosensitive surface of the receiving sensor 73 after being focused and corrected, and all the reflected lasers can be received by the receiving sensor 73, thereby improving utilization of received energy. In addition, stray light outside an optical path of the reflected lasers and/or stray light in a direction different from that of the reflected lasers cannot be directed to the receiving sensor after passing through the receiving optical system, thereby avoiding an interference problem caused when the stray light is received by the receiving sensor. Therefore, efficiency of receiving energy of the reflected laser by the laser receiving module is high, a capability of inhibiting interference light and the stray light is greatly improved, and a volume of the laser receiving device is also reduced.

Figure 6:
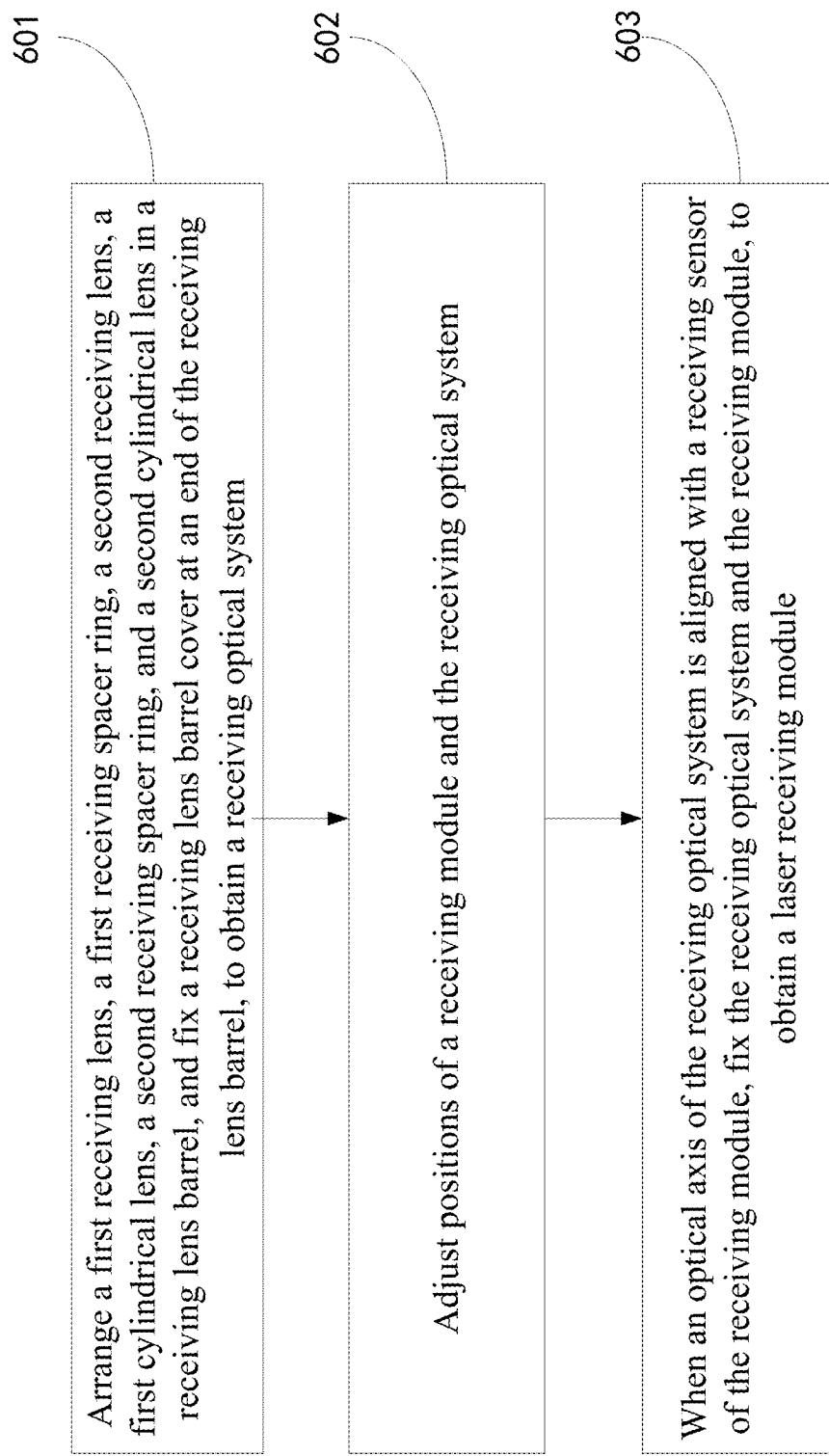
FIG. 6 is a flowchart of a mounting and adjustment method of a laser receiving module according to an embodiment of the present invention.

An embodiment of the present invention further provides an optical adjustment method for a laser receiving module. As shown in FIG. 6, the optical adjustment method is applied to the foregoing laser receiving module, and the method includes the following steps:

Step 601: Arrange a first receiving lens 91, a first receiving spacer ring 51, a second receiving lens 92, a first cylindrical lens 3, a second receiving spacer ring 53, and a second cylindrical lens 4 in a receiving lens barrel, and fix a receiving lens barrel cover at an end of the receiving lens barrel, to obtain a receiving optical system.

The first receiving lens 91 may be a convex spherical lens 1, and the second receiving lens 92 may be a concave spherical lens 2.

Step 602: Adjust positions of the receiving module and the receiving optical system.

Step 603: When an optical axis of the receiving optical system is aligned with a receiving sensor 73 of the receiving module, fix the receiving optical system and the receiving module, to obtain the laser receiving module.

In the foregoing optical adjustment method for a laser receiving module, the first receiving lens 91, the first receiving spacer ring 51, the second receiving lens 92, the first cylindrical lens 3, the second receiving spacer ring 53, and the second cylindrical lens 4 can be easily and rapidly assembled, to form the receiving optical system. Therefore, all the reflected lasers received by the receiving optical system can be directed to the photosensitive surface of the receiving sensor after being focused and corrected, and all the reflected lasers can be received by the receiving sensor, thereby improving utilization of received energy. In addition, stray light outside an optical path of the reflected lasers and/or stray light in a direction different from that of the reflected lasers cannot be directed to the receiving sensor after passing through the receiving optical system, thereby avoiding an interference problem caused when the stray light is received by the receiving sensor. Therefore, efficiency of receiving energy of the reflected laser by the laser receiving module is high, a capability of inhibiting interference light and the stray light is greatly improved, and a volume of the laser receiving device is also reduced.

Figure 7:
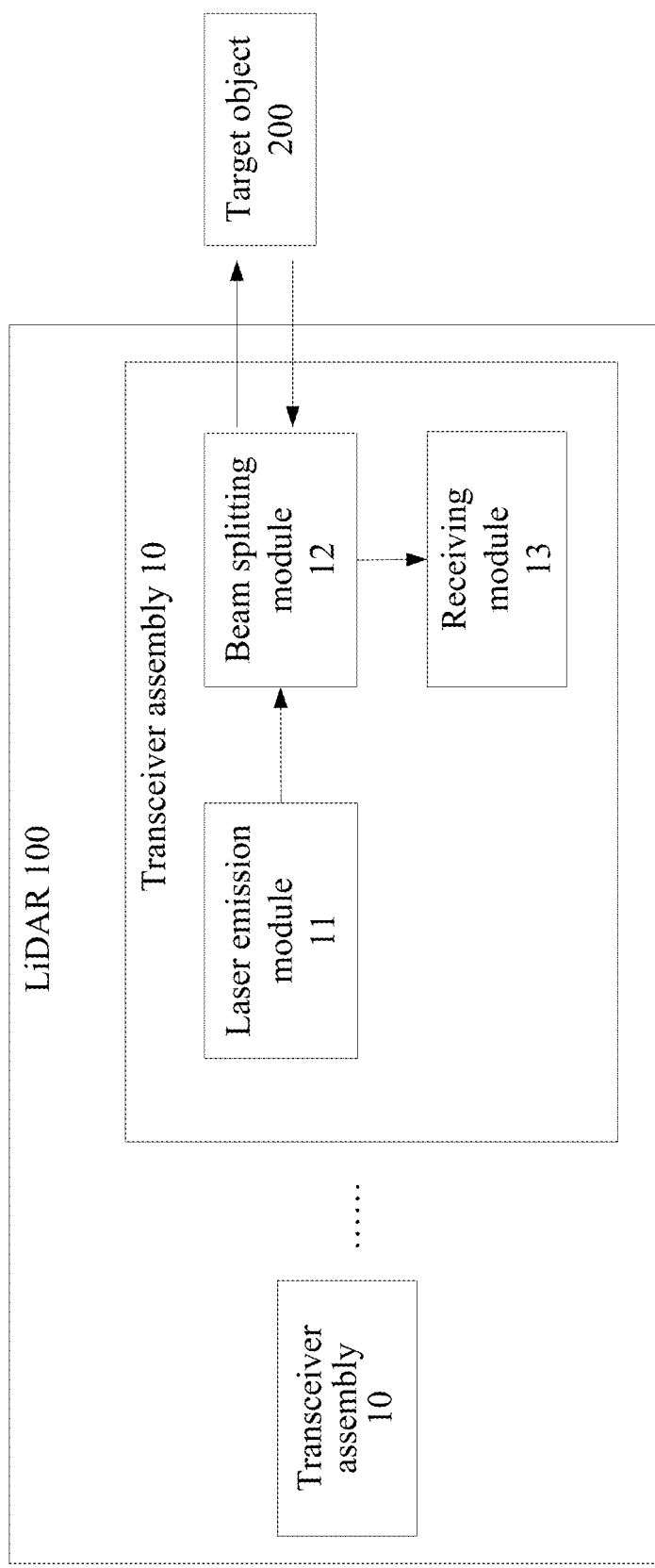
FIG. 7 is a structural diagram of a LiDAR according to an embodiment of the present invention.

An embodiment of the present invention further provides a LiDAR. FIG. 7 is a structural block diagram of the LiDAR 100 according to an embodiment of the present invention. As shown in FIG. 7, the LiDAR 100 includes at least one transceiver assembly 10. The transceiver assembly 10 includes the laser emission module 11, a beam splitting module 12, and a laser receiving module 13, where the laser emission module 11 is configured to emit a collimated outgoing laser, the beam splitting module 12 is configured to enable the outgoing laser to be emitted into a detection region after passing through, and deflect a reflected laser with a same incident axis as the outgoing laser toward the laser receiving module 13, and the laser receiving module 13 is configured to receive the reflected laser. The reflected laser is the laser returning after the outgoing laser is reflected by an object in a detection region.

Herein, the LiDAR 100 can include one or more transceiver assemblies 10. The specific number of the transceiver assemblies 10 may depend on an actual need. This is not limited in this embodiment. Each transceiver assembly 10 has a limited horizontal field of view. When the LiDAR 100 needs a larger horizontal field of view, for example, when the LiDAR 100 needs to reach a horizontal field of view of 120°, the LiDAR 100 can use four transceiver assemblies 10 with an angle of view of 30°, and a plurality of transceiver assemblies 10 are spliced in a horizontal direction.

Specifically, the outgoing laser emitted by the laser emission module 11 of the LiDAR 100 is emitted to the detection region after passing through the beam splitting module 12. When there is a target object 200 in the detection region, the outgoing laser is reflected by the target object 200 to obtain the reflected laser. When returning, the reflected laser enters the beam splitting module 12, and the beam splitting module 12 deflects the reflected laser toward the laser receiving module 13, so that the reflected laser is received by the laser receiving module 13.

Figure 8:
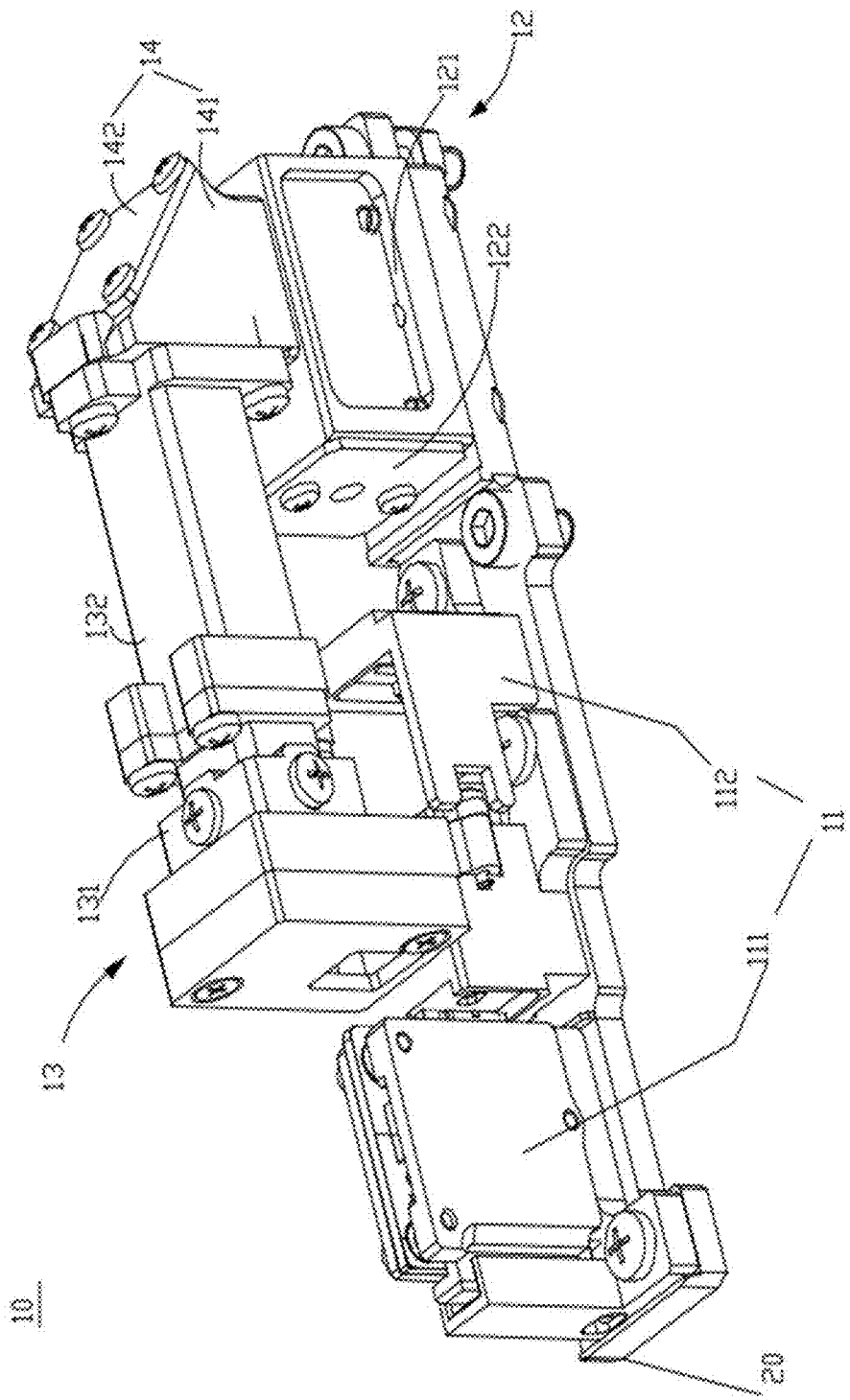
FIG. 8 is a three-dimensional diagram of a transceiver assembly of LiDAR according to an embodiment of the present invention.

FIG. 8 is a schematic structural diagram of a transceiver assembly 10 according to an embodiment of the present invention. The transceiver assembly 10 is fixed on a base 20 as a whole. When each transceiver assembly 10 is mounted, there is a corresponding mounting angle, and the transceiver assembly 10 only needs to be mounted and fixed on the base (not shown in the figure) of the LiDAR in the corresponding angle. In addition, a material and shape of the base 20 can be selected based on an actual situation. This is not limited in this embodiment.

As shown in FIG. 8, the transceiver assembly 10 in the LiDAR 100 in this embodiment of the present invention includes a laser emission module 11, a beam splitting module 12, and a laser receiving module 13, and further includes a reflector module 14. The reflector module 14 is arranged between the beam splitting module 12 and the laser receiving module 13, and the reflected laser passes through the beam splitting module 12 and then is reflected by the reflector module 14 toward the laser receiving module 13. A specific structure of the laser receiving module 13 is shown in FIG. 4. A specific working principle and working process are described in FIG. 4 in the foregoing embodiments. Details are not described herein again.

An optical axis of the reflected laser passing through the reflector module 14 can be parallel to an optical axis of the emitted light signal, or there can be a specific angle between the optical axis of the reflected laser and the optical axis of the emitted light signal. This is not limited in this embodiment, provided that the reflected laser passing through the reflector module 14 can enter the laser receiving module 13. Therefore, the receiving optical path is folded and compressed, reducing a length of occupied space and an occupied volume.

Specifically, the outgoing laser emitted by the laser emission module 11 is emitted to the detection region after passing through the beam splitting module 12. The outgoing laser is reflected by the target object 200 in the detection region to obtain the reflected laser. After entering the beam splitting module 12, the reflected laser is directed at the reflector module 14, and then reflected by the reflector module 14 toward the laser receiving module 13, and finally, the reflected laser is received by the laser receiving module 13.

In this embodiment, the laser emission module 11 includes a laser emission module 111 and a collimating element 112 provided sequentially along an outgoing laser. The laser emission module 111 is configured to generate the outgoing laser, and the collimating element 112 is configured to collimate the outgoing laser generated by the laser emission module 111 and then emit the outgoing laser. The collimating element 112 is provided between the laser emission module 11 and the beam splitting module 12. An emitted light signal is directed toward the beam splitting module 12 after being collimated by the collimating element 112. Positions of the laser emission module 111 and the collimating element 112 are relatively fixed.

In this embodiment, the beam splitting module 12 includes: a beam splitter support component 121 and a beam splitter; and the beam splitter support component 121 is integrated or connected with the base 20, and the beam splitter is fixed to the beam splitter support component 121. The beam splitter support component 121 is a cubic structure, and a beam splitter mounting position is provided in the structure. The beam splitter is fixed to the beam splitter support component 121 at a preset tilt angle and position through the beam splitter mounting position. Optionally, the beam splitter support component 121 may be a preset structure at the same tilt angle as the beam splitter, and may be integrated or connected with the base 20, to ensure accuracy of the position when the beam splitter is mounted. A material of the beam splitter support component 121 can be the same as that of the base 20. When the beam splitter is mounted, the beam splitter only needs to be mounted on the beam splitter support component 121 correspondingly. A connection between the beam splitter and the beam splitter support component 121 can be a buckle connection, an adhesive connection, or the like. Optionally, the beam splitter may be a polarization beam splitter, a reflector with a central hole, a semi-transparent and semi-reflective reflector, or the like.

The beam splitting module 12 may also include a secondary beam splitter. The secondary beam splitter is put between the beam splitter and the collimating element 112. The secondary beam splitter is fixed by the beam splitter support component 121, a secondary beam splitter mounting position is provided in the beam splitter support component 121, and the secondary beam splitter is provided in the beam splitter support component 121 at a preset tilt angle and position through the secondary beam splitter mounting position, and is fixed by a lock block 122. Optionally, the secondary beam splitter may be a polarization beam splitter (PBS). The secondary beam splitter is added to the beam splitting module 12, so that intensity of polarized light emitted to the beam splitter can be scattered and local heating is reduced. When the secondary beam splitter is configured to filter out polarized light S, the polarized light S does not enter the laser receiving module 13 after being deflected, thereby avoiding influence of the filtered polarized light S on a receiving function of the laser receiving module 13, and improving detection performance and detection accuracy. In addition, even if the beam splitting module 12 does not include a secondary beam splitter, the beam splitting module 12 can still complete a light signal transceiver function of the transceiver assembly 10, to meet a requirement for the detection performance.

The reflector module 14 may include a reflector support component 141 and a reflector; and the reflector is fixed by the reflector support component 141. The reflector module 14 may include at least one reflector, and the reflector may be a flat reflector, a cylindrical reflector, an aspherical curvature reflector, or the like. Optionally, the reflector module 14 further includes a reflector cover 142. The reflector is fixed on the reflector cover 142, and the reflector cover 142 is connected to the reflector support component 141, thereby fixing the reflector. A connection between the reflector cover 142 and the reflector support component 141 can be a buckle connection, an adhesive connection, a screw connection, or the like. Optionally, the beam splitter support component 121 and the reflector support component 141 are aligned and connected. A connection between the beam splitter support component 121 and the reflector support component 141 may be a connection manner such as a buckle, a screw, a pin, or an adhesive.

The laser receiving module 13 is aligned and then connected with the reflector support component 141. Specifically, the laser receiving module 13 includes a receiving optical system 132 and a receiving module 131, and a reflected laser is sent to the receiving module 131 after being focused and corrected by the receiving optical system 132. Specific structures of the receiving optical system 132 and the receiving module 131 are shown in FIG. 4 and are described in detail in the foregoing embodiments. Details are not described herein again. The foregoing receiving module may include at least one of detectors such as APD (Avalanche Photon Diode), an APD array (Avalanche Photon Diode array), MPPC (Multi-pixel Photon Counter), SPAD (Single Photon Avalanche Diode), PMT (Photomultiplier Tube) and SIPM (Silicon Photomultipliers). The receiving optical path and the emission optical path are coaxial.

Figure 9:
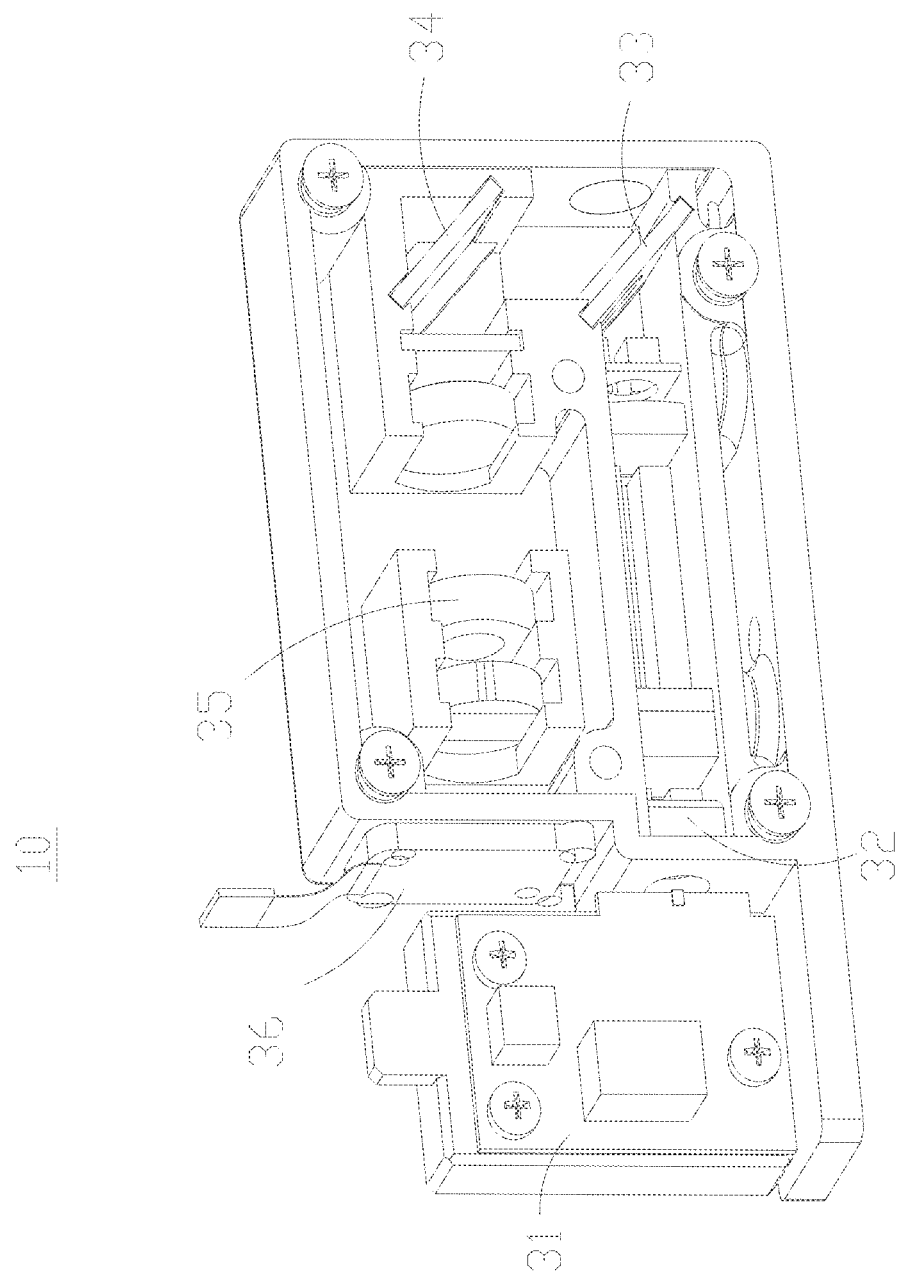
FIG. 9 is a three-dimensional diagram of a transceiver assembly of other LiDAR according to an embodiment of the present invention.

FIG. 9 is a schematic structural diagram of a transceiver assembly 10 according to another embodiment of the present invention. As shown in FIG. 9, the transceiver assembly 10 includes a laser emission module 31, a collimating element 32, a beam splitting module 33, a reflector module 34, a receiving optical system 35, and a receiving module 36 provided sequentially along an outgoing laser. The laser emission module 31 includes an emission plate, and the emission plate is provided with an emitter for emitting the outgoing laser. The collimating element 32 is configured to collimate an outgoing laser emitted by an emitter. The beam splitting module 33 is configured to direct a passing outgoing laser outward, and deflect a reflected laser with a same incident axis as the outgoing laser toward the reflector module 34. The reflector module 34 is configured to receive the reflected laser reflected by the beam splitting module 12 and direct the reflected laser toward the receiving optical system 35. The receiving optical system 35 is used to focus and correct the reflected laser, and direct the reflected laser that is focused and corrected toward the receiving module 36. The receiving module 36 is configured to receive the reflected laser. The collimating element 32, the beam splitting module 33, the reflector module 34, and the receiving optical system 35 are all provided in an integrated transceiver housing, and each device is positioned and fixed by a preset structure.

In this embodiment, for specific optical composition and structures of the laser emission module 31, the collimating element 32, the beam splitting module 33, the reflector module 34, the receiving optical system 35, and the receiving module 36, reference may be made to the foregoing embodiments. Specifically, for optical composition and structure of the laser emission module 31, reference may be made to the laser emission module 111 in FIG. 8 in the foregoing embodiments; for optical composition and structure of the collimating element 32, reference may be made to the collimating element 112 in FIG. 8 in the foregoing embodiments; for optical composition and structure of the beam splitting module 33, reference may be made to the beam splitting module 12 in FIG. 8 in the foregoing embodiments; for optical composition and structure of the reflector module 34, reference may be made to the reflector module 14 in FIG. 8 in the foregoing embodiments; for optical composition and structure of the receiving optical system 35, reference may be made to the receiving optical system 132 in FIG. 8 in the foregoing embodiments; and for optical composition and structure of the receiving module 36, reference may be made to the receiving module 131 in FIG. 8 in the foregoing embodiments. Details are not described herein again.

In this embodiment, the laser emission module 31 is provided in a transceiver housing. The collimating element 32, the beam splitting module 33, the reflector module 34, the receiving optical system 35, and the receiving module 36 each are provided in an integrated transceiver housing to form the transceiver assembly 10. The foregoing modular design facilitates modular application, optical adjustment, assembly, and replacement.

Another embodiment of the present invention also provides a LiDAR. The LiDAR includes the transceiver assembly 10 and the scanning module in the foregoing embodiments, and the scanning module may be a MEMS (Micro-electro-mechanical System) mirror. The LiDAR also includes a refractor module, including a plurality of refractors, and each refractor is provided in a one-to-one correspondence with a transceiver assembly 10. A transceiver module includes at least one transceiver assembly 10. An outgoing laser of the transceiver assembly 10 is directed toward a corresponding refractor, and then directed to the MEMS mirror after being reflected by the refractor. The MEMS mirror emits the outgoing laser to the detection region and performs scanning. A reflected laser reflected by an object in the detection region returns and is received by the MEMS mirror and directed toward the refractor, the refractor reflects the reflected laser to the corresponding transceiver assembly 10, and the transceiver assembly 10 receives the reflected laser.

Further, based on the foregoing LiDAR, an embodiment of the present invention provides a smart sensing device including the LiDAR in the foregoing embodiments. The smart sensing device can be a vehicle, a UAV, a robot, or other related devices that uses the LiDAR for smart sensing and detection.

It can be seen from the foregoing description that, based on the receiving optical system, the laser receiving module, the LiDAR, the optical adjustment method for the laser receiving module, and the smart sensing device are provided in the embodiments of the present invention, to adjust and correct the beam diameter and the shape of the light spot of the received reflected laser, so that the received reflected laser can better match the photosensitive surface of the receiving sensor, and therefore, all the reflected lasers received by the receiving optical system can be directed to the photosensitive surface of the receiving sensor after being focused and corrected, and all the reflected lasers can be received by the receiving sensor, thereby improving utilization of received energy. In addition, stray light outside an optical path of the reflected lasers and/or stray light in a direction different from that of the reflected lasers cannot be directed to the receiving sensor after passing through the receiving optical system, thereby avoiding an interference problem caused when the stray light is received by the receiving sensor. A percentage of receiving energy of the reflected laser by the LiDAR is high, a capability of inhibiting interference light and the stray light is greatly improved, and a volume of the laser receiving device is also reduced.

It can be seen from the foregoing description that for simplicity, the receiving optical system can be viewed to be inputting large-diameter parallel light and outputting small-diameter parallel light (the small-diameter reflected laser matches the photosensitive surface of the receiving sensor), the stray light outside the optical path of the reflected laser cannot be directed to the receiving sensor after passing through the receiving optical system, and the beam diameter and the shape of the light spot of the reflected laser output by the receiving optical system are adjusted and corrected, thereby ensuring receiving accuracy and reliability. The receiving optical system can change the combination of curvature and the types of the lens group in the receiving optical system, to adjust the beam diameter and the shape of the light spot of the reflected laser (that is, a divergence angle of the beam); and because the receiving optical system has adjustment and correction functions, and there is no need to add another diaphragm in field of view to confine the angle of view, which effectively reduces costs, and mounting and adjustment of the receiving optical system is simple. In addition, the cylindrical lens is introduced in the receiving optical system in the embodiments of the present invention, so that the reflected laser can better match the photosensitive surface of the receiving sensor, the energy receiving efficiency is relatively high, and the interference problem caused when the stray light is received by the receiving sensor is avoided.

It should be noted that unless otherwise specified, the technical or scientific terms used in the embodiments of this application should have general meanings understood by a person of ordinary skill in the art to which the embodiments of this application belong.

In the description of implementing novel embodiments, azimuth or position relationships indicated by the technical terms such as "center," "longitudinal," "lateral," "length," "width," "thickness," "above," "under," "front," "rear," "left," "right," "vertical," "horizontal," "top," "bottom," "inner," "outer," "clockwise," "counterclockwise," "axial," "radial," and "circumferential" are based on the azimuth or position relationships shown in the drawings, are merely intended to describe the embodiments of this application and simplify the descriptions, but are not intended to indicate or imply that the indicated device or element shall have specific azimuth or be formed and operated in specific azimuth, and therefore cannot be understood as a limitation to the embodiments of this application.

In addition, the technical terms such as "first" and "second" are merely intended for a purpose of description, and shall not be understood as an indication or implication of relative importance or implicit indication of a quantity of indicated technical features. In the description of the embodiments of this application, "a plurality of" means two or more, unless otherwise specifically defined.

In the description of implementing novel embodiments, unless otherwise clearly specified and limited, technical terms such as "mounting," "connected," "connection," and "fixing" should be understood in a general sense. For example, these technical terms may be a fixed connection, a detachable connection, or an integrated connection; or may alternatively be a mechanical connection or an electrical connection; or may be a direct connection, an indirect connection by using an intermediate medium, or an internal link of two elements or an interaction of two elements. A person of ordinary skill in the art may understand specific meanings of the foregoing terms in the embodiments of this application based on a specific situation.

In the description of implementing novel embodiments, unless otherwise clearly specified and defined, that a first feature is "above" or "under" a second feature may mean that the first feature and the second feature are in direct contact, or the first feature and the second feature are in indirect contact through an intermediate medium. Moreover, that a first feature is "above," "over," and "on" a second feature may mean that the first feature is right above or diagonally above the second feature, or may merely indicate that a horizontal height of the first feature is greater than that of the second feature. That a first feature is "below," "under," and "beneath" a second feature may mean that the first feature is right below or diagonally below the second feature, or may merely indicate that a horizontal height of the first feature is less than that of the second feature.

In conclusion, it should be noted that the foregoing embodiments are merely intended for describing the technical solutions of this application, but not for limiting this application. Although this application is described in detail with reference to the foregoing embodiments, persons of ordinary skills in the art should understand that they may still make modifications to the technical solutions described in the foregoing embodiments or make equivalent replacements to some or all technical features thereof, without departing from the scope of the technical solutions of the embodiments of this application. All these modifications or replacements shall fall within the scope of the claims and specification of this application. Particularly, the technical features mentioned in all embodiments may be combined in any manner, provided that no structural conflict occurs. This application is not limited to the specific embodiments disclosed in this specification, but includes all technical solutions that fall within the scope of the claims.

What is claimed is:

1. A receiving optical system, comprising: an optical receiving module, a first cylindrical lens, and a second cylindrical lens, wherein the optical receiving module is configured to receive a reflected laser and focus the received reflected laser, and wherein the first cylindrical lens is configured to receive the focused reflected laser and adjust the reflected laser in a first direction; wherein the second cylindrical lens is configured to receive the reflected laser adjusted by the first cylindrical lens, and readjust the reflected laser in a second direction; wherein the optical receiving module comprises: a first receiving lens and a second receiving lens, through the first receiving lens and the second receiving lens, a beam diameter of the reflected laser is gradually switched to a beam diameter matching a photosensitive surface of a receiving sensor; wherein the first receiving lens is configured to focus the received reflected laser, and switch the reflected laser from a first beam diameter to a second beam diameter, and wherein the second receiving lens is configured to receive the reflected laser switched to the second beam diameter, switch the reflected laser to a third beam diameter, and emit the reflected laser of the third beam diameter toward the first cylindrical lens; wherein the third beam diameter is greater than or approximately equal to the second beam diameter, and the second beam diameter is less than the first beam diameter.

2. The receiving optical system according to claim 1, wherein the first receiving lens is a convex spherical lens, and the second receiving lens is a concave spherical lens.

3. The receiving optical system according to claim 2, wherein the concave spherical lens and the first cylindrical lens are integrated, and a surface of the concave spherical lens faces the convex spherical lens.

4. The receiving optical system according to claim 1, wherein the first cylindrical lens diffuses the reflected laser in the first direction.

5. The receiving optical system according to claim 1, wherein the second cylindrical lens diffuses the reflected laser in the second direction.

6. The receiving optical system according to claim 1, wherein the first direction in which the first cylindrical lens adjusts the reflected laser is the same as the second direction in which the second cylindrical lens adjusts the reflected laser.

7. The receiving optical system according to claim 1, further comprising:
a receiving lens barrel and a receiving lens barrel cover,
wherein the first receiving lens, the second receiving lens, the first cylindrical lens, and the second cylindrical lens are sequentially provided in the receiving lens barrel, and
wherein the receiving lens barrel cover is fixed at an end of the receiving lens barrel.

8. The receiving optical system according to claim 7, wherein a first receiving spacer ring is provided between the first receiving lens and the second receiving lens.

9. The receiving optical system according to claim 8, wherein a second receiving spacer ring is provided between the first cylindrical lens and the second cylindrical lens.

10. The receiving optical system according to claim 9, wherein an inner wall of at least one of the first receiving spacer ring or the second receiving spacer ring is at least one of an extinct thread or an extinct coating.

11. The receiving optical system according to claim 1, wherein same side faces of the first receiving lens, the second receiving lens, the first cylindrical lens, and the second cylindrical lens are all set as planes.

12. A laser receiving module, comprising a receiving module and a receiving optical system, wherein the receiving optical system, comprising: an optical receiving module, a first cylindrical lens, and a second cylindrical lens, wherein the optical receiving module is configured to receive a reflected laser and focus the received reflected laser, and wherein the first cylindrical lens is configured to receive the focused reflected laser and adjust the reflected laser in a first direction; wherein the second cylindrical lens is configured to receive the reflected laser adjusted by the first cylindrical lens, and readjust the reflected laser in a second direction; wherein the optical receiving module comprises: a first receiving lens and a second receiving lens, through the first receiving lens and the second receiving lens, a beam diameter of the reflected laser is gradually switched to a beam diameter matching a photosensitive surface of a receiving sensor; wherein the first receiving lens is configured to focus the received reflected laser, and switch the reflected laser from a first beam diameter to a second beam diameter, and wherein the second receiving lens is configured to receive the reflected laser switched to the second beam diameter, switch the reflected laser to a third beam diameter, and emit the reflected laser of the third beam diameter toward the first cylindrical lens; wherein the third beam diameter is greater than or approximately equal to the second beam diameter, and the second beam diameter is less than the first beam diameter; wherein an incident end of the receiving module is aligned and connected with an outgoing end of the receiving optical system, and is configured to receive a reflected laser, wherein the receiving module comprising a receiving sensor and a receiving circuit board, the receiving sensor is configured to receive the reflected laser, convert a light signal into an electrical signal, and send the electrical signal to the receiving circuit board, and wherein the receiving circuit board processes the received electrical signal.

13. The laser receiving module according to claim 12, wherein the receiving module further comprises a receiving housing,
wherein the receiving sensor and the receiving circuit board are accommodated in the receiving housing.

* * * * *